United States Patent [19]

Schenk

[11] Patent Number: 5,065,412
[45] Date of Patent: Nov. 12, 1991

[54] PROCESS AND CIRCUIT ARRANGEMENT FOR DIGITAL CONTROL OF THE PHASE OF SCANNING CLOCK PULSES

[75] Inventor: Heinrich Schenk, Munich, Fed. Rep. of Germany

[73] Assignee: Siemens Aktiengesellschaft, Berlin and Munich, Fed. Rep. of Germany

[21] Appl. No.: 400,192

[22] Filed: Aug. 29, 1989

[30] Foreign Application Priority Data

Aug. 30, 1988 [EP] European Pat. Off. ........ 88114140.2

[51] Int. Cl.$^5$ ............................... H03D 3/24
[52] U.S. Cl. ........................... 375/111; 375/101
[58] Field of Search ............ 375/110, 111, 101, 106, 375/120; 364/724.2; 328/55; 341/200, 155; 331/11, 12, 17, 18; 329/307

[56] References Cited

U.S. PATENT DOCUMENTS 4,389,616 6/1983 Göckler et al. ............... 375/111
4,775,851 10/1988 Borth ............................ 341/155

FOREIGN PATENT DOCUMENTS 0092400 10/1983 European Pat. Off. .
3532857 9/1985 Fed. Rep. of Germany .

OTHER PUBLICATIONS

Telcom Report, vol. 8 (1985), Special Issue, "Integrated Services Digital Network ISDN", pp. 22-27.
Unterrichtsblaetter derDeutschen Bundespost, vol. 34, 1981, No. 2, pp. 75-83.

Primary Examiner—Benedict V. Safourek
Assistant Examiner—Tesfaldet Bocure
Attorney, Agent, or Firm—Adel A. Ahmed

[57] ABSTRACT

For conversion of digital signals received in analog form, scanning samples of these digital signals are sent to a digital signal receiving unit at intervals fixed by the occurrence of the scanning clock pulses after an analog-digital conversion. The respective digital signal receiving unit then supplies the phase control signals derived from the received digital signals. After filtering, these phase control signals are sent at given intervals to a clock generator for delivering the scanning clock pulses. The phase control signals are filtered in the form $$Ta(i) = a1(Te(i) - a2\ Te(i-1)) + a3\ Ta(i-1)$$

where a1, a2 and a3 are filter coefficients, Ta(i) and Ta(i−1) are filtered phase control signals at the times i and (i−1) and Te(i) and Te(i−1) are phase control signals made available at the times i and (i−1). The filtered phase control signals are then sent to the clock generator in quantized form.

25 Claims, 1 Drawing Sheet

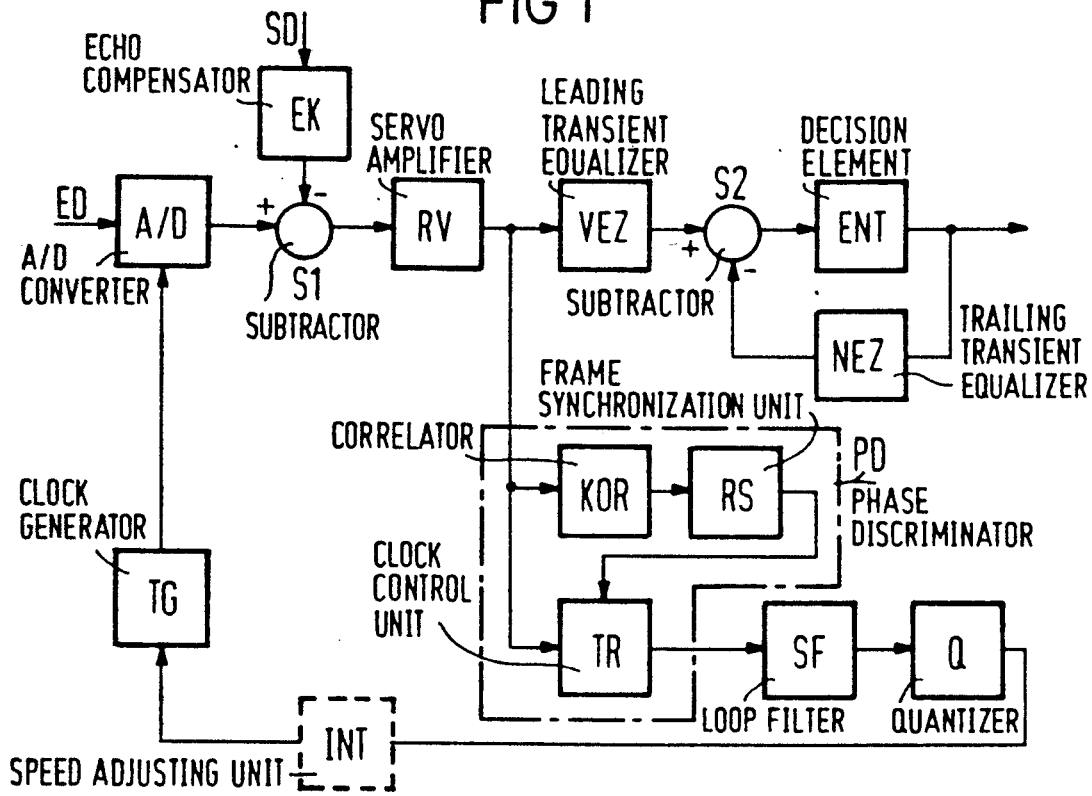
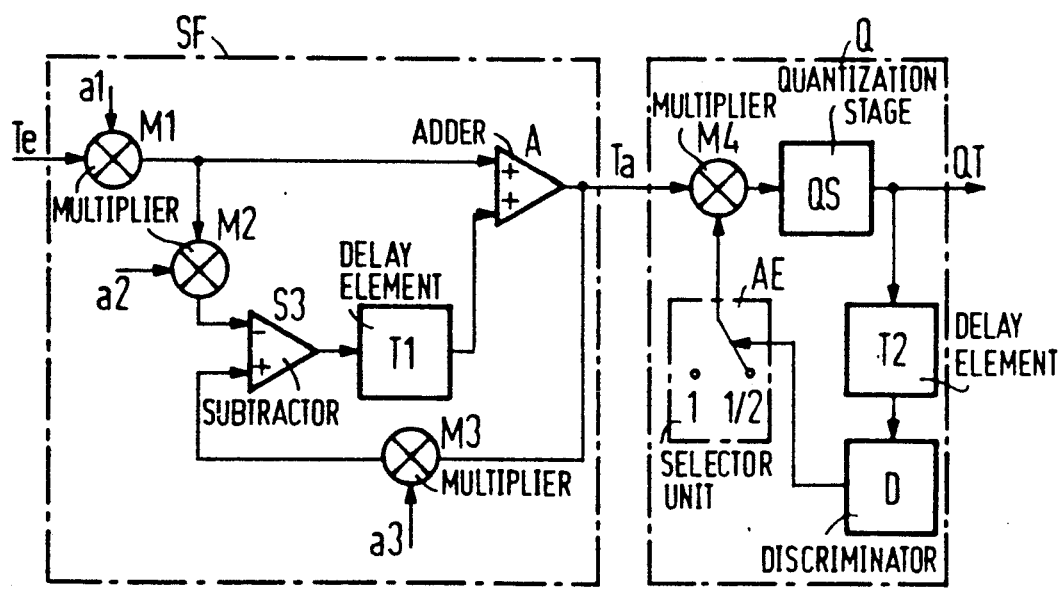

PROCESS AND CIRCUIT ARRANGEMENT FOR DIGITAL CONTROL OF THE PHASE OF SCANNING CLOCK PULSES

FIELD OF THE INVENTION

The present invention relates to a process and a circuit arrangement for digital control of the phase of scanning clock pulses.

DESCRIPTION OF THE RELATED ART

A process known for control is digital of the phase of scanning clock pulses in a subscriber's station circuit of a integrated services digital network (*Telcom Report*, Vol. 8 (1985), Special Issue, "Integrated Services Digital Network ISDN", pp. 22–27). In this known subscriber's station circuit scanning samples of digital signals received in analog form are sent after analog-digital conversion to a receiving unit at intervals that are fixed by the occurrence of scanning clock pulses for conversion of the received digital signals. By means of clocking and clock control, the technical circuitry implementation of which will not be detailed here, the scanning clock pulses are derived from the received digital signals.

In addition, it is known that phase control circuits can be provided with a loop filter in the form of a low pass filter with a small bandwidth for clock recovery in digital transmission systems in order to suppress phase fluctuation (phase jitter) of the line signal due to the transmission line. (*Unterrichtsblatter der Deutschen Bundespost*, Vol 34, 1981, No. 2, pp. 75–83) However, implementation of such a loop filter will not be detailed here.

An object of the present invention is to provide a way to filter the phase control signals provided for phase control of scanning clock pulses by a simple process.

SUMMARY OF THE INVENTION

In accordance with an aspect of the invention a process for digital control of the phase of scanning clock pulses in a digital signal receiving unit which receives scanning samples of digital signals received in analog form at intervals fixed by the scanning clock pulses after analog-digital conversion for conversion of the received digital signals and where phase control signals derived from the received digital signals are made available and after filtering at given intervals these phase control signals are sent to a clock generator for delivering the scanning clock pulses is characterized in that the filtering of the phase control signals is performed in the form $$Ta(i) = a1\,(Te(i) - a2\,Te(i-1)) + a3\,Ta(i-1)$$

where a1, a2 and a3 are filter coefficients, $Ta(i)$ and $Ta(i-1)$ are filtered phase control signals at the times i and $(i-1)$ and $Te(i)$ and $Te(i-1)$ are phase control signals made available at the times i and $(i-1)$, and the filtered phase control signals are sent in quantized form to the clock generator.

This type of filtering can always be used to advantage when clock pulses of the same frequency, e.g., with the control of an externally supplied master clock, are available in a transmitting unit that supplies the digital signals and a receiving unit that works together with the latter and only phase control is to be performed in the receiving unit.

An especially favorable implementation of this type of filtering is achieved by setting the filter coefficients at $a1 = 2^{-L1}$, $a2 = (1 - 2^{-L2})$ and $a3 = (1 - 2^{-L3})$ where L1, L2 and L3 are integers.

In addition, it is expedient to perform the quantization of a filtered phase control signal at time i in accordance with the quantized phase control signal delivered to the clock generator at time $(i-1)$. As a result of this variable quantization, phase control signal with a value of "0" filtered in a steady-state are made available, so no change in the clock generator is performed in this state.

The process can also be designed in such a way that the number of phase control signals delivered to the clock generator during a given interval of time is reduced in comparison with the number of quantized filtered phase control signals. This reduction makes it possible, for example, to adjust the control rate of the clock control circuit to the control speed of the echo compensator in a digital signal receiving unit that receives compensation signals from an echo compensator.

A circuit arrangement for carrying out the process according to the present invention with a digital signal receiving unit included in a clock control circuit comprising a phase discriminator and a clock generator that can be controlled by it, where the phase discriminator receives the scanning samples of received digital signals and derives phase control signals from the scanning samples and sends them to the clock generator at given intervals through a filter circuit, characterized in that the filter circuit makes available phase control signals in the form $$Ta(i) = a1(Te(i) - a2\,Te(i-1)) + a3\,Ta(i-1)$$

where a1, a2 and a3 are filter coefficients, $Ta(i)$ and $Ta(i-1)$ are filtered phase control signals at the time i and $(i-1)$, $Te(i)$ and $Te(i-1)$ are phase control signals made available by the phase discriminator at the times i and $(i-1)$, and the filtered phase control signals are supplied to the clock generator by way of a quantizer.

In accordance with an aspect of the invention, the circuit arrangement is characterized in that the quantizer has at the input end a multiplier with two inputs, one of which receives the filtered phase control signals and the other input is connected to a controllable selector unit which provides optionally one of two given constants, and the selector unit can be controlled by a control unit that is connected at the input end to the output of the quantizer such that when a phase control signal occurs at time $(i-1)$ at the output of the quantizer (with a value of "0"), the selector provides the lower of the two constants (at time i) but when the value is not "0" it provides the higher of the two constants.

In accordance with another aspect of the invention, the circuit arrangement is characterized in that a control rate adjusting unit is connected between the quantizer and the clock generator and it provides only a reduced number of phase control signals during a given interval to the clock generator in comparison with the number of phase control signals made available by the quantizer.

An aspect of this circuit arrangement is the relatively small expense of the circuitry required to implement the filter arrangement and the quantizer connected to it.

BRIEF DESCRIPTION OF THE DRAWINGS

The present invention will now be explained in greater detail with the aid of the figures, in which FIG. 1 shows a digital signal receiving unit where the present invention is used; and FIG. 2 shows the design of the filter arrangement which is only indicated schematically in FIG. 1 and the quantizer connected downstream therefrom.

DETAILED DESCRIPTION OF THE PREFERRED EMBODIMENTS

The digital signal receiving unit in FIG. 1 shows in schematic form the receiver of a subscriber's station circuit for the integrated services digital network ISDN. The subscriber's station circuit may be designed here for duplex transmission of digital signals over a two-wire line in the duplex channel system. For example, binary signals to be transmitted over the two-wire line as communications signals from such a subscriber's station circuit are first converted to multistage signals, e.g., three-stage signals, and delivered as analog signals after pulse shaping in a data block over a hybrid set. In such a data block which may include 120 bits, for example, synchronizing information is also contained in addition to the communications signals. In the present practical example a barker code with a length of 11 bits is selected as the synchronizing information.

Analog signals to be received by the respective subscriber's station circuit by way of the two-wire line first pass through the above-mentioned hybrid set and then go to the digital signal receiving unit shown in FIG. 1. The input of this receiving unit is an analog-digital converter A/D which takes scanning samples from the analog signals supplied to it, e.g., at intervals corresponding to a bit length of the signals transmitted in a data block, and converts them to a 16-bit digital signal. The scanning clock pulses required for this purpose are made available by a controllable clock generator TG.

The 16-bit digital signals are then sent in succession to a subtractor S1 which simultaneously receives compensation signals from an echo compensator EK. These compensation signals compensate for the echo signal components that are contained in the 16-bit digital signals and are superimposed on the received analog signals due to reflection on the line in delivery of data blocks of the two-wire line as described above or due to incomplete decoupling of the transmission paths of the hybrid set.

The compensated digital signals are then relayed for further processing by way of a servo amplifier RV and an equalizing arrangement, which eliminates most of the distortion caused by the electrical properties of the two-wire line. The equalizing arrangement has a leading transient equalizer VEZ, for example, whose output signals are supplied to a subtractor S2. A second input of this subtractor is connected to the output of a trailing transient equalizer NEZ. This equalizer is connected at the input end to the output of a decision element ENT connected downstream from subtractor S2.

The aforementioned circuit parts of the digital signal receiving unit shown in FIG. 1 will not be described in detail below because their operation is already sufficiently well known.

A phase discriminator PD is coupled to the output of the aforementioned servo amplifier RV and derives phase control signals from the signals supplied to it such that the phase control signals are proportional to the prevailing control deviation. In the present practical example, the phase discriminator has a correlator KOR connected at the input end to the output of servo amplifier RV and at the output end to a frame synchronization unit RS. With the help of these two units, framing clock pulses are derived from the signals occurring at the output of servo amplifier RV and are sent together with the signals occurring at the output of the control amplifier to a clock control unit TR. From these signals, clock control unit TR derives phase control signals that are proportional to the prevailing control deviation while receiving the above-mentioned synchronization information.

With regard to phase discriminator PD it should also be pointed out that one possible implementation has already been described above. However, this version is not essential to the present invention. Instead, all that is required is that the phase discriminator must derive phase control signals that are proportional to the prevailing control deviations from the signals supplied to it. Thus, for example, it would also be possible for the phase discriminator to derive the phase control signals directly from the received communications signals without synchronization information in communications signal transmission over a two-wire line.

Phase control signals delivered by phase discriminator PD generally have a noise component. To suppress this noise and thus to achieve a low phase jitter, the phase control signals pass through a narrow band loop filter SF. The filtered phase control signals are then supplied to a quantizer Q, which provides 4-bit quantized phase control signals at its output and these quantized phase control signals are applied to the aforementioned controllable clock generator to control the phase of the scanning clock pulses. The clock generator may have, for example, a clock divider that can be adjusted by the supplied phase control signals for this purpose.

FIG. 2 shows a possible design of aforementioned loop filter SF and quantizer Q connected downstream from it. The loop filter has a multiplier M1 at the input end to which the phase control signals Te delivered by phase discriminator PD and a constant filter coefficient a1 are supplied. The resultant product signal goes to a first input of an adder A on the one hand and to an input of a multiplier M2 on the other hand and the multiplier also receives a constant filter coefficient a2 at a second input.

The output signal of this multiplier is applied to an input (−) of a subtractor S3. Another input of this subtractor is connected to the output of a multiplier M3 whose two inputs receive a constant filter coefficient a3 and the output signal of the aforementioned adder A.

The output of subtractor S3 is applied a second input of adder A by way of a delay element T1 whose time constant corresponds to the interval between two successive phase control signals.

The loop filter described above supplies phase control signals in the following form at its output:

$$Ta(i)=a1(Te(i)-a2Te(i-1))+a3Ta(i-1)$$

where a1, a2 and a3 denote the aforementioned filter coefficients, Ta(i) and Ta(i−1) are the phase control signals that occur at times i and (i−1) at the output of the loop filter and Te(i) and Te(i−1) are the phase control signals made available by the phase discriminator PD at times i and (i−1). A favorable implementation of the loop filter derives when the filter coefficients are selected as follows:

a1 = $2^{-L1}$
a2 = $1-2^{-L2}$
a3 = $1-2^{-L3}$.

L1, L2 and L3 here are integers. For example, L2=4 and L3=6 may be selected. L1 depends on the scaling of the phase control signals delivered by phase discriminator PD. As mentioned previously, the phase control signals should be proportional to the phase deviations. An appropriate value of L1 can be determined empirically in order to optimize the control rate of the control circuit shown in FIG. 2.

The filtered phase control signals delivered by loop filter SF are sent to a multiplier M4 of quantizer Q. Another input of this multiplier is connected to the output of a controllable selector unit AE. This selector unit delivers optionally two different constants by which the filtered phase control signals are multiplied. In the present example the constants are set at 1 and 0.5.

The output of multiplier M4 is connected to a quantization stage QS which delivers 4-bit quantization phase control signals QT which are in turn applied to clock generator TG on the one hand, as already explained above, and on the other hand are applied to a delay element T2. This time constant corresponds to the interval between two successive quantized phase control signals. The output of this delay element is connected to a discriminator D that delivers a control signal whose level indicates whether the phase control signal occurring at the output of delay element T2 has a value of "0" or a different value. The selection of one of the two constants in selector unit AE is controlled with this control signal. The control takes place by the fact that the constant 0.5 is made available at the time i in the case of a quantized phase control signal with a value of "0" occurring at the time (i−1) at the output of quantization stage QS. The phase control value occurring at the point in time i, which because of a short-term fault may have a value other than "0", is thus multiplied by the factor ½, which results in a shift to the right by one bit position. Thus, in the steady state, if a value other than "0" occurs in the least significant bit position of the group, then the shift of the bit group to the right yields again the value of "0". When the value is not "0", however, the constant 1 is selected. The quantizer Q thus has a hysteresis behavior by means of which the value "0" is applied at the output of the quantizer in a steady state of the phase control circuit. As a result, the aforementioned clock divider of the clock generator TG remains unchanged in this steady state and thus phase jitter is prevented.

The exemplary digital signal receiving unit described with the aid of FIG. 1 can also be designed by connecting a speed adjusting unit INT between quantizer Q and clock generator TG as indicated in FIG. 1. Thus, the control rate of the clock control circuit can be reduced, e.g., to match it to the control rate of the echo compensator EK. The matching unit may comprises of an integrator circuit, e.g., in the form of a resettable counting circuit or a ring counter circuit which integrates the quantized phase control signals supplied to it and does not deliver a phase control signal to clock generator TG until a preset threshold value has been exceeded. Another possibility comprises of using a counter circuit which provides a phase control signal for clock generator TG only when a given number of quantized phase control signals is available and a preset threshold value has been exceeded by these phase control signals.

In conclusion, it should also be pointed out that the present invention has been described above by way of an example of a digital signal receiving unit for reception of digital signals over a two-wire line, but this invention can be used in general whenever phase control of scanning clock pulses must be performed in a digital signal receiving system with the help of a phase control circuit on the basis of the received signals.

I claim:

1. A process for digital control of the phase of clock scanning pulses in a digital signal receiving unit which receives input data signal sin analog form and converts them to digital signals, comprising the steps of:

converting the input data signals in analog form to output digital signals at sampling intervals controlled by clock scanning pulses;

determining phase deviations in the output digital signals and providing an output of phase control signals proportional thereto;

filtering the phase control signals according to the relation:

$$Ta(i)=(a1\times Te(i))-(a2\times Te(i-1))+(a3\times Ta(i-1)),$$

wherein a1, a2, and a3 are filter coefficients, Ta(i) and Ta(i−1) are filtered phase control signals at the times (i) and (i−1), and Te(i) and Te(i−1) are input phase control signals at the times (i) and (i−1);

rendering an output of the filtered phase control signals in a quantized form; and using a clock generator for generating clock scanning pulses for the above-mentioned converting step having their phase controlled in accordance with the filtered and quantized phase control signals.

2. A process according to claim 1 characterized in that the filter coefficients are set at $a1=2^{-L1}$, $a2=-(1-2^{-L2})$ and $a3=(1-2^{-L3})$ where L1, L2 and L3 are integers.

3. A process according to claim 1 characterized in that quantization of a filtered phase control signal is performed at time i in accordance with the quantized phase control signal delivered to the clock generator at time (i−1).

4. A process according to claim 2 characterized in that quantization of a filtered phase control signal is performed at time i in accordance with the quantized phase control signal delivered to the clock generator at time (i−1).

5. A process according to claim 1 characterized in that the number of phase control signals delivered to the clock generator during a given interval is reduced in comparison with the quantized filtered phase control signals.

6. A circuit arrangement for digital control of the phase of clock scanning pulses in a digital signal receiving unit which receives input data signals in analog form and converts them to digital signals, comprising:

an analog-to-digital (A/D) converter for converting the input data signals in analog form to output digital signals at sampling intervals controlled by clock scanning pulses;

a phase discriminator coupled to the output of said A/D converter for determining phase deviations in the output digital signals and providing an output of phase control signals proportional thereto;

filter means coupled to the output of said phase discriminator for filtering the phase control signals according to the relation:

$$Ta(i)=(a1\times Te(i))-(a2\times Te(i-1))+(a3\times Ta(i-1)),$$

wherein a1, a2, and a3 are filter coefficients, Ta(i) and Ta(i−1) are filtered phase control signals at the times (i) and (i−1), and Te(i) and Te(i−1) are input phase control signals at the times (i) and (i−1);

quantizer means operative in conjunction with said filter means for rendering an output of the filtered phase control signals in a quantized form; and a clock generator coupled to the output of said quantizer means for generating the clock scanning pulses having their phase controlled in accordance with the filtered and quantized phase control signals.

7. A circuit arrangement according to claim 6 characterized in that the quantizer has at the input end a multiplier with two inputs, one of which receives the filtered phase control signals and the other input is connected to a controllable selector unit which provides optionally one of first and second constants, said second constant being less than said first constant, and the selector unit can be controlled by a control unit that is connected at the input end to the output of the quantizer such that when a phase control signal which has a value of "0" at the time i occurs at time (i−1) at the output of the quantizer, the selector provides said second constant at time i but when eh value is not "0" it provides said first constant.

8. A circuit arrangement according to claim 6 characterized in that a control rate adjusting unit is connected between the quantizer and the clock generator and it provides only a reduced number of phase control signals in intervals each determined by a number of said phase control signals to the clock generator in comparison with the number of phase control signals made available by the quantizer.

9. A circuit arrangement according to claim 6, wherein said filter coefficients are selected to be:
a1 = 2−L1,
a2 = (1−2−L2), and
a3 = (1−2−L3)
where L1, L2, and L3 are integers.

10. In combination with a process for digital control of the phase of scanning clock pulses in a signal receiving unit which process includes the steps of scanning received analog signal sat intervals fixed by scanning clock pulses, converting the received analog signals into digital signals, deriving from the digital signals phase control signals, filtering at given intervals said phase control signals and applying said filtered, phase control signals to a clock generator for delivering the scanning clock pulses, the improvement therewith wherein the step of filtering of the phase control signals is performed in the form:

$$Ta(i) = a1 \ (Te(i) - a2 \ Te(i-1) + a3 \ Ta(i-1)$$

where a1, a2 and a3 are filter coefficients, Ta(i) and Ta(i−1) are filtered phase control signals at the times i and (i−1) and Te(i) and Te(i−1) are phase control signals made available at the times i and (i−1), quantizing the filtered phase control signals and sending the quantized filtered phase control signals to the clock generator.

11. A process according to claim 10 characterized in that the filter coefficients are set at
a1 = 2−L1, a2 = (1−2L2) and a3 = (1−2−L3)
where L1, L2 and L3 are integers.

12. A process according to claim 10 characterized in that quantization of a filtered phase control signal is performed at time i in accordance with the quantized phase control signal delivered to the clock generator at time (i−1).

13. A process according to claim 11 characterized in that quantization of a filtered phase control signal is performed at time i in accordance with the quantized phase control signal delivered to the clock generator at time (i−1).

14. A process according to claim 10 characterized in that the number of quantized phase control signals delivered to the clock generator in intervals each determined by a number of said phase control signals is less than said number of the phase control signals.

15. A process according to claim 11 characterized in that the number of quantized phase control signals delivered to the clock generator in intervals each determined by a number of said phase control signals is less than the number of phase control signals.

16. A process according to claim 12 characterized in that the number of quantized phase control signals delivered to the clock generator in intervals each determined by a number of said phase control signals is less than the number of the phase control signals.

17. A process according to claim 13 characterized in that the number of quantized phase control signals delivered to the clock generator in intervals each determined by a number of said phase control signals is less than the number of the phase control signals.

18. A circuit arrangement for carrying out the process according to claim 10 with a signal receiving unit which includes a clock control circuit comprising a phase discriminator and a clock generator that is controlled by the phase discriminator, where the phase discriminator receives the digital signals and derives phase control signals from the digital signals and sends the phase control signals to the clock generator at given intervals through a filter circuit, characterized in that the filter circuit makes available phase control signals in the form $$Ta(i) = a1(Te(i) - a2 \ Te(i-1) + a3 \ Ta(i-1)$$

where a1, a2 and a3 are filter coefficients, Ta(i) and Ta(i−1) are filtered phase control signals at the times i and (i−1), Te(i) and Te(i−1) are phase control signals made available by the phase discriminator at the times i and (i−1), and the filtered phase control signals are supplied to the clock generator by way of a quantizer.

19. A circuit arrangement for carrying out the process according to claim 14 with a signal receiving unit which includes a clock control circuit comprising a phase discriminator and a clock generator that is controlled by the phase discriminator, where the phase discriminator receives digital signals and derives phase control signals from the digital signals and sends the phase control signals to the clock generator at given intervals through a filter circuit, characterized in hat the filter circuit makes available phase control signals in the form $$Ta(i) = a1(Te(i) - a2 \ Tc(i-1) + a3 \ Ta(i-1)$$

where a1, a2 and a3 are filer coefficients, Ta(i) and Ta(i−1) are filtered phase control signal sat the times i and (i−1), Te(i) and Te(i−1) are phase control signals made available by the phase discriminator at the times i and (i−1), and the filtered phase control signals are supplied to the clock generator by way of a quantizer.

20. A circuit arrangement according to claim 18 characterized in that the quantizer has the input end of multiplier with two inputs, one of which receives the filtered phase control signals and the other input is connected to a controllable selector unit which provides optionally one of first and second constants, said second constant being less than said first constant and the selector unit is controlled by a control unit that is connected at the input end to the output of the quantizer such that when a quantized phase control signal occurs at time (i−1) at the output of the quantizer with a value of "0", the selector provides said second constant at time i but when the value is not "0" it provides said first constant.

21. A circuit arrangement according to claim 19 characterized in that the quantizer has at the input end a multiplier with two inputs, one of which receives the filtered phase control signal sand the other input is connected to a controllable selector unit which provides optionally one of first and second constants, said second constant being less than said first constant, and the selector unit is controlled by a control unit that is connected at the input end to the output of the quantizer such that when a quantized phase control signal occurs at time (i−1) at the output of the quantizer with a value of "0", the selector provides said second constant at time i, but when the value is not "0" it provides said first constant.

22. A circuit arrangement according to claim 18 characterized in that a control rate adjusting unit is connected between the quantizer and the clock generator and the control rate adjusting unit provides a number of phase control signals in intervals each determined by a number of said phase control signals to the clock generator which number is less than the number of quantized phase control signals made available by the quantizer.

23. A circuit arrangement according to claim 19 characterized in that a control rate adjusting unit is connected between the quantizer and the clock generator and the control rate adjusting unit provides a number of phase control signals in intervals each determined by a number of said phase control signals to the clock generator which number is less than the number of quantized phase control signals made available by the quantizer.

24. A circuit arrangement according to claim 20 characterized in that a control rate adjusting unit is connected between the quantizer and the clock generator and the control rate adjusting unit provides a number of phase control signals in intervals each determined by a number of said phase control signals to the clock generator which number is less than the number of quantized phase control signals made available by the quantizer.

25. A circuit arrangement according to claim 21 characterized in that a control rate adjusting unit is connected between the quantizer and the clock generator and the control rate adjusting unit provides a number of phase control signals in intervals each determined by a number of phase control signals to the clock generator which number is less than the number of quantized phase control signals made available by the quantizer.

* * * * *